United States Patent [19]

Schwartzkopf

[11] Patent Number: 4,624,908

[45] Date of Patent: Nov. 25, 1986

[54] DEEP ULTRA-VIOLET LITHOGRAPHIC RESIST COMPOSITION AND PROCESS OF USING

[75] Inventor: George Schwartzkopf, Franklin Township, Somerset County, N.J.

[73] Assignee: J. T. Baker Chemical Company, Phillipsburg, N.J.

[21] Appl. No.: 723,273

[22] Filed: Apr. 15, 1985

[51] Int. Cl.$^4$ .......................... G03C 1/54; G03C 1/60; G03F 7/26

[52] U.S. Cl. .................................... 430/192; 430/165; 430/193; 430/326; 534/556

[58] Field of Search ............... 430/192, 193, 165, 326; 534/556

[56] References Cited

U.S. PATENT DOCUMENTS

| | | | |
|---|---|---|---|
| 3,130,048 | 4/1964 | Fritz et al. | 430/193 |
| 4,207,107 | 6/1980 | Ross | 430/193 |
| 4,284,706 | 8/1981 | Clecak et al. | 430/193 |
| 4,339,522 | 7/1982 | Balanson et al. | 430/193 |
| 4,522,911 | 6/1985 | Clecak et al. | 430/193 |

OTHER PUBLICATIONS

Korobitsyna, I. K. et al., Zh. Org. Khim. 12, pp. 1245–1260, 1976.
Dinaburg, M. S., "Photosensitive Diazo Cpds", The Focal Press, pp. 181–182, 1964.
Current Abstracts, vol. 66, No. 2, #25014, 7/1977.
Grant, B. D. et al., IEEE Transactions on Electron Devices, vol.-ED-28, No. 11, pp. 1300–1305, 11/1981.

Primary Examiner—Charles L. Bowers, Jr.
Attorney, Agent, or Firm—George W. Rauchfuss, Jr.

[57] ABSTRACT

Positive deep ultra-violet photoresists which are base developable comprise base soluble polymers and as photosensitive solubilizing agents compounds of the formula

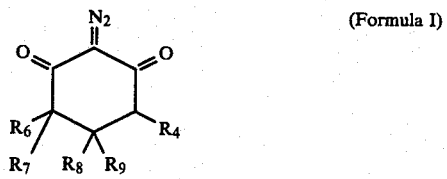

(Formula I)

wherein:
$R_4$ is hydrogen or —C(O)$R_5$ in which $R_5$ is an alkoxy group having from 1 to about 20 carbon atoms;
$R_6$, $R_7$, $R_8$ and $R_9$ may each be the same or different and be hydrogen or alkyl of from 1 to about 6 carbon atoms when $R_4$ is —C(O)$R_5$; or
when $R_4$ is either hydrogen or —C(O)$R_5$,
 (a) one of either $R_6$ or $R_7$ and one of either $R_8$ and $R_9$ is hydrogen and the other of either $R_6$ or $R_7$ and the other of either $R_8$ or $R_9$ which is not hydrogen together form an alkylene group of from 1 to about 6 carbon atoms, or
 (b) one set of either $R_6$ and $R_7$ together or $R_8$ and $R_9$ together is a cycloalkyl group of from 4 to 8 carbon atoms and the other set of either $R_6$ and $R_7$ or $R_8$ and $R_9$ that is not cycloalkyl are each hydrogen.

30 Claims, No Drawings

DEEP ULTRA-VIOLET LITHOGRAPHIC RESIST COMPOSITION AND PROCESS OF USING

FIELD OF THE INVENTION

This invention relates to deep ultra-violet photoresists compositions containing a resin and photosensitive solubilizing agents and to a process for forming a lithographic resist image employing said compositions.

BACKGROUND OF THE INVENTION

Due to the advancing state of the art in the projection or lithographic printing field, it has become highly desirable to be able to provide image geometries of less than 2 microns and very high device packing densities. In order to most advantageously obtain same, it has become highly desirable that projection imaging wavelengths in the deep ultra-violet (UV) region of below about 300 nm be employed. It is therefore desirable that suitable deep UV resist compositions be available for use with imaging wavelengths in the deep UV region.

Recently U.S. Pat. No. 4,339,522 to R. Balamson et al., issued July 13, 1982 and assigned to International Business Machines Corporation, disclosed such a deep UV resist composition which comprises phenolic-aldehyde resins sensitized with Meldrum's acid diazo or a homologue thereof.

A need exists for other such deep UV resists and especially deep UV resists providing for improved image resolution characteristics. Especially useful would be deep UV resist compositions providing good resolution of 0.75 micron lines or smaller.

SUMMARY OF THE INVENTION

Positive deep UV photoresists which are sensitive to light in the deep UV range of from about 240–300 nm and which are base soluble are provided by resists comprising a base soluble polymer and photosensitive solubilizing agents selected from the group consisting of compounds of the formula

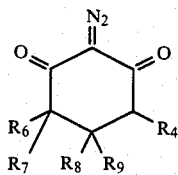

(Formula I)

wherein:

$R_4$ is hydrogen or $-C(O)R_5$ in which $R_5$ is an alkoxy group having from 1 to about 20 carbon atoms;

$R_6$, $R_7$, $R_8$ and $R_9$ may each be the same or different and be hydrogen or alkyl of from 1 to about 6 carbon atoms when $R_4$ is $-C(O)R_5$; or when $R_4$ is either hydrogen or $-C(O)R_5$, (a) one of either $R_6$ or $R_7$ and one of either $R_8$ and $R_9$ is hydrogen and the other of either $R_6$ or $R_7$ and the other of either $R_8$ or $R_9$ which is not hydrogen together form an alkylene group of from 1 to about 6 carbon atoms, or (b) one set of either $R_6$ and $R_7$ together or $R_8$ and $R_9$ together is a cycloalkyl group of from 4 to 8 carbon atoms and the other set of either $R_6$ and $R_7$ or $R_8$ and $R_9$ that is not cycloalkyl are each hydrogen.

In the above Formula I when $R_5$ is the alkoxy group, the alkoxy group may have from 1 about 20 carbon atoms, preferably from 1 to about 6 carbon atoms and most preferably is ethoxy.

The solubilizing agents of Formula I are inclusive of compounds of the following formulas

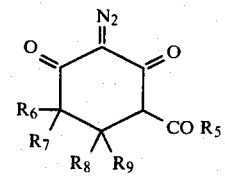

(Formula II)

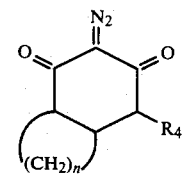

(Formula III)

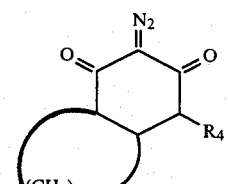

(Formula IV)

and

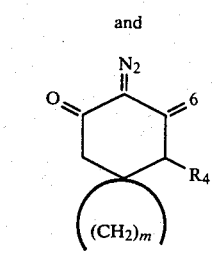

(Formula V)

wherein $R_4$, $R_5$, $R_6$, $R_7$, $R_8$, and $R_9$ are as defined for Formula I and n is a number of from 1 to 6 and m is a number of from 4 to 8.

Preferred as solubilizing agents of this invention are: compounds of Formula II in which $R_5$ is an ethoxy group, $R_6$ and $R_7$ are each hydrogen and $R_8$ and $R_9$ are each methyl group; compounds of Formula III in which $R_4$ is hydrogen or a carbethoxy group and n is equal to 4; compounds of Formulas IV and V in which $R_4$ is hydrogen or a carbethoxy group and m is equal to 5.

As examples of such preferred solubilizing agents there can be mentioned for example
trans-2-diazodecalin-1,3-dione,
ethyl 3-diazo-2,4-dioxodecalincarboxylate,
ethyl 5-diazo-2,2-dimethyl-4,6-dioxocyclohexane carboxylate, and
2-diazo-5,5-pentamethylenecyclohexane-1,3-dione The compounds useful as solubilizing agents according to this invention are either known or can be easily prepared. For example, the β-diazo-α, γ-diketone compounds of Formula I wherein $R_4$ is hydrogen or $-C(O)R_5$ in which $R_5$ is an alkoxy group are prepared by reacting any suitable sulfonylazide, such as p-toluenesulfonyl azide (TSA) or naphthylenesulfonyl azide (NSA), with readily available α, γ-diketones in the presence of a catalyst such as dry triethylamine and any suitable solvent such as ethanol, benzene or acetonitrile any the like. Generally after reacting for a period of about 3 to about 5 hours the reaction mixture is filtered to remove the precipitated sulfonamide and the filtrate is evaporated to dryness. The product may then be partially purified by partitioning between ether and dilute alkali hydroxide. The residues may be purified either by recrystallization, if the product is a solid, or by chromatography, such as flash chromatography on silica gel if the product is an oil.

Exemplary of the preparation of compounds of Formula I for use as solubilizing agents according to the invention are the following preparations.

PREPARATION 1

Trans-2-Diazodecalin-1,3-dione

A solution of 1.06 gm (6.38 nmole) of decalin-1,3-dione in 3 mL of dry ethanol was cooled in an ice bath and treated with 0.89 mL of (6.4 mmole) triethylamine followed by 1.128 gm (6.50 mmole) of p-toluenesulfonyl azide. The mixture was stirred in the ice bath for 4 hours, then concentrated in vacuo (less than 40° C.). The residue was dissolved in 45 mL of ether and the ether washed with a solution of 0.42 gm KOH in 30 mL of water, dried ($Na_2SO_4$), filtered, and concentrated to 1.22 gm of an orange oil. This was chromatographed on 40-micron silica giving 0.45 gm of trans-2-diazodecalin-1,3-dione, mp 81°-3° C.

PREPARATION 2

Ethyl 3-Diazo-2,4-dioxodecalincarboxylate

The subject compound was prepared in a manner described in Preparation 1 except that ethyl 2,4-dioxodecalincarboxylate was employed as a starting reagent in place of decalin-1,3-dione. Chromatography of the reaction product gave the desired product as a pale yellow oil. Elemental analysis found: C, 58.75; H, 5.98; N, 10.40; calculated for $C_{13}H_{16}N_2O_4$: C, 59.08; H, 6.10; N, 10.60.

PREPARATION 3

Ethyl 5-Diazo-2,2-dimethyl-4,6-dioxocyclohexane carboxylate

The subject compound was prepared in the manner described in Preparation 1 except that ethyl 2,2-dimethyl-4,6-dioxocyclohexane carboxylate was employed as a starting reagent in place of decalin-1,3-dione. Chromatography of the reaction product gave the desired product as a pale yellow oil. Elemental analysis found: C, 55.32; H, 5.84; N, 12.12; calculated for $C_{11}H_{14}N_2O_4$: C, 55.46; H, 5.92; N, 11.76.

PREPARATION 4

2-Diazo-5,5-pentamethylenecyclohexane-1,3-dione

This compound was prepared as described in M. Regitz and D. Stadler, Ann. Chem., 678, 214 (1965). The subject product was obtained and had a mp. of 88.5°-89.5° C.

When the solubilizing agents of this invention are added to base soluble polymers and the resulting photoresist compositions are cast as films on substrates the solubilizing agents increase the solubility of the polymeric film in developer in the area of the film which has been exposed to the deep UV light compared to the area of the polymeric film not exposed to UV light. In the areas of the film exposed to deep UV light the solubilizing agents of this invention increase the solubility of the polymeric film to developers in exposed pattern areas.

Any suitable base soluble photoresist polymer can be employed in the photoresist compositions of this invention, such as the commercially available phenol-formaldehyde resins, cresol-formaldehyde resins, poly(vinylphenol), poly(methyl methacrylate-methacrylic acid) resins and the like. A particularly preferred resin is a poly(methyl methacrylate-methacrylic acid) resin having a methacrylic acid content of between about 20 to 30%, preferably about 25% by weight, having a molecular weight (by gel permeation chromatography) of between about 20,000 to 120,000, preferably about 80,000, and having a narrow polydispersity. Such a resin is one prepared according to the following method. A solution of 4.9 liters of the appropriate amounts of methyl methacrylate and methacrylic acid (a total of 17.5 moles of the two monomers) is stirred under $N_2$ at 80±2° C. as 300 ml aliquots of a solution of the appropriate amount of 2,2-diazo bis(2-methylpropionitrile) (3.5 g for a polymer with a molecular weight of 80,000 or 16.5 for a polymer with a molecular weight of 20,000) in 2100 ml of 1,2-dimethoxyethane were added at 30 min. intervals. When the addition is completed, the reaction mixture is stirred at 80±2° C. for an additional 16 hours before being evaporated to dryness. The residue is washed with 15 liters of dichloromethane for 24 hours and then the wash is decanted and discarded. The insoluble polymer is dissolved in 15 liters of methanol and the solution is filtered. The filtrate is evaporated to dryness to yield the polymeric product.

The photoresist compositions of this invention comprise about 50 to 85% by weight base soluble polymer and from about 15 to about 50% by weight of a solubilizing agent of this invention, preferably about 70% base solution polymer and about 30% solubilizing agent. The resists may be formed readily by dissolving the polymer and solubilizing agent in a common solvent and casting a film onto an appropriate substrate. Any suitable film-forming solvent may be used, generally film-forming solvents having a boiling point of from about 120° to 210° C., such as for example, diglyme, methyl isobutyl ketone, 2-ethoxyethanol, 2-methoxyethyl acetate, γ-butyrolactone and the like. The resist forming composition will generally comprise from about 50 to about 95% by weight solvent and about 5 to about 50% by weight solid (i.e. base soluble polymer and solubilizing agent combined). Preferably the solvent will comprise about 80 to 85% by weight and the solids about 15 to 20% by weight. The amount of solids employed will be dependent upon the desired viscosity of the resist forming composition and is such as permits the casting of a resist of about 1 micron thick.

An especially preferred resist composition of this invention comprises about 87% by weight 2-methoxyethyl acetate solvent and about 14% by weight solids which is a mixture of (a) a poly(methyl methacrylate-methacrylic acid) of molecular weight about 80,000 in which the ratio of methyl methacrylate to methacrylic acid is 75/25 and (b) ethyl 3-diazo-2,4-dioxodecalincarboxylate wherein the weight ratio of polymer to dione solubilizing agent is 70/30.

The solubilizing agents of this invention possess improved thermal stability and lower volatility compared to compounds previously proposed for such use. When incorporated into castable resist compositions with film-forming polymer and an appropriate film-forming solvent and subject to pre-baking to set the photoresist on the substrate, the lower volatility of these solubilizing agents results in cured photoresist with less loss of solubilizing agent thereby leading to an improved solubility differential between exposed and unexposed photoresist.

Lithographic resist compositions as described in the preceding paragraphs were prepared and cast as films onto appropriate wafer substrates and pre-backed at a temperature of from about 56° to about 126° C., preferably from about 56° to about 85° C., for a period of from about 30 to about 45 minutes to drive off most of the solvent and then tested for usefulness as deep UV resists as described in the following procedure. Using a high-pressure mercury-xenon lamp and a deep-UV filter transmitting from 240–300 nm, three-inch wafers with 150 to 1050 nm thick resist films were exposed through an opening 70 mm×150 mm for varying periods of time. Images were formed in the resists after developing for from about 5 to 1200 seconds in an alkaline developer, such as for example, aqueous ammonia solution, aqueous triethanolamine, aqueous ammonium acetate, aqueous tris(hydroxymethyl)aminomethane. Complete removal of resist occurred in those areas exposed to at least 150 mJ/cm$^2$ radiation.

The resist compositions so prepared and tested were as described in the following table of Examples.

TABLE

| Example No. | Sol. Agent Prep. Comp. No. | Agent Amount | Polymer* Amount | Solvent | Solvent Amount |
|---|---|---|---|---|---|
| 1 | 1 | 0.39 gm | 0.91 gm | 2-ethoxyethanol | 8.6 ml |
| 2 | 2 | 5.51 gm | 12.89 gm | 2-methoxyethyl acetate | 112 ml |
| 3 | 3 | 1.00 gm | 2.33 gm | 2-ethoxyethanol | 22 ml |
| 4 | 4 | 1.00 gm | 2.33 gm | 2-ethoxyethanol | 22 ml |

*Poly(methyl methacrylate-methacrylic acid) of molecular weight about 80,000, ratio 75/25.

EXAMPLE 1

The formulation from Preparation Compound 1 was spun onto silicon wafers and backed in a convection oven for 30 min a 65° C. giving a 774 nm thick resist film. A 75×150 mm area of this film was exposed to light from a high-pressure mercury-xenon lamp filtered through a deep-UV filter transmitting from 240–300 nm. Complete removal of the exposed resist was achieved by developing with 0.4% aq. triethanolamine for 30 sec. The unexposed area retained a 652 nm layer of resist (thickness after development [TAD]=84%).

EXAMPLE 2

The procedure was similar to Example 1 using the formulation from Preparation Compound 2. Baking was at 83° C. for 30 minutes giving a 1039 nm thick film. Development for 80 seconds removed the resist in the exposed area. The unexposed area retained an 895 nm layer of resist (TAD=86%).

EXAMPLE 3

The procedure was similar to Example 1 using the formulation from Preparation Compound 3. Baking was at 79° C. for 30 minutes giving a 723 nm thick film. Development for 150 seconds removed the resist in the exposed area. The unexposed area retained a 416 nm layer of resist (TAD=58%).

EXAMPLE 4

The procedure was similar to Example 1 using the formulation from Preparation Compound 4. Baking was at 79° C. for 30 min giving an 800-nm thick film. Development for 10 seconds in 1% aqueous tris(hydroxymethyl)aminomethane removed the resist in the exposed area. The unexposed area retained a 474 nm layer of resist (TAD=59%).

EXAMPLE 5

A similar experiment was performed using a Perkin Elmer Corporation Micralign 500 projection aligner in the UV II mode to expose the resist coated wafers. Five inch wafers coated with resist composition of Example 2 at a thickness of about 1000 nm and pre-baked at 70° C. for 30 minutes were employed. The exposed wafers were developed for 120 sec. in 0.4% aqueous triethanolamine. SEM observations indicated 0.75 micrometer lines and spaces could be printed in this way.

I claim:

1. A lithographic deep UV light sensitive positive photoresist composition for use with deep UV light of less than 300 nm comprising a base soluble film-forming positive photoresist polymer and in admixture therewith an effective amount of a deep UV photosensitive solubilizing agent compound of the formula:

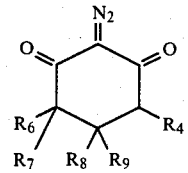

(Formula I)

wherein:
$R_4$ is —C(O)$R_5$ in which $R_5$ is an alkoxy group having from 1 to about 20 carbon atoms;
$R_6$, $R_7$, $R_8$ and $R_9$ may each be the same or different and are selected from the group consisting of hydrogen and alkyl of from 1 to about 6 carbon atoms or
(a) one of either $R_6$ or $R_7$ and one of either $R_8$ and $R_9$ is hydrogen and the other of either $R_6$ or $R_7$ and the other of either $R_8$ or $R_9$ which is not hydrogen together form an alkylene group of from 1 to about 6 carbon atoms, or
(b) one set of either $R_6$ and $R_7$ together or $R_8$ and $R_9$ together is a cycloalkyl group of from 4 to 8 carbon atoms and the other set of either $R_6$ and $R_7$ or $R_8$ and $R_9$ that is not cycloalkyl are each hydrogen,
whereby upon exposure to deep UV radiation the exposed composition becomes more soluble in alkaline developer.

2. A composition of claim 1 wherein the base soluble film-forming polymer is a resin selected from the group consisting of phenol-formaldehyde, cresol-formaldehyde, poly(vinylphenol) and poly(methyl methacrylate-methacrylic acid) resins.

3. A composition of claim 1 wherein the solubilizing agent is present in an amount of from about 15 to about 50% by weight based on the combined weight of polymer and agent.

4. A composition of claim 2 wherein the solubilizing agent is present in an amount of from about 15 to about 50% by weight based on the combined weight of polymer and agent.

5. A composition of claim 1 wherein the solubilizing agent is a compound of the formula

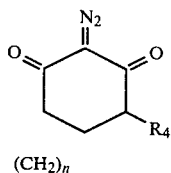

wherein n is a number of from 1 to 6 and $R_4$ is as defined in said claim 1.

6. A composition of claim 1 wherein the solubilizing agent is a compound of the formula

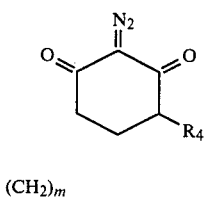

wherein m is a number of from 4 to 8 and $R_4$ is as defined in said claim 1.

7. A composition of claim 1 wherein the solubilizing agent is a compound of the formula

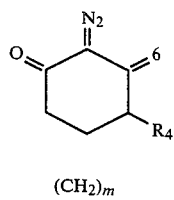

wherein m is a number of from 4 to 8 and $R_4$ is as defined in said claim 1.

8. A composition of claim 5 wherein the solubilizing agent is ethyl 3-diazo-2,4-dioxodecalincarboxylate.

9. A composition of claim 1 wherein the solubilizing agent is ethyl 5-diazo-2,2-dimethyl-4,6-dioxocyclohexane carboxylate.

10. A composition of claim 4 wherein the solubilizing agent is ethyl 3-diazo-2,4-dioxodecalincarboxylate.

11. A composition of claim 4 wherein the solubilizing agent is ethyl 5-diazo-2,2-dimethyl-4,6-dioxocyclohexane carboxylate.

12. A composition of claim 8 wherein the polymer is a poly(methyl methacrylate-methacrylic acid).

13. A composition of claim 12 wherein the solubilizing agent is present in an amount of from about 15 to about 50% by weight based on the combined weight of polymer and agent and the poly(methyl methacrylate-methacrylic acid) has a molecular weight of about 80,000 and the ratio of methacrylate to methacrylic acid is 75/25.

14. A composition of claim 13 wherein the solubilizing agent is present in an amount of about 30% by weight.

15. A castable resist composition comprising the lithographic resist composition of claim 1 in a film-forming solvent having a boiling point of from about 120° to 210° C.

16. A castable resist composition of claim 15 wherein the solvent comprises from about 50 to about 95% by weight of the castable composition.

17. A castable resist composition of claim 16 wherein the solvent is selected from the group consisting of diglyme, methyl isobutyl ketone, 2-ethoxyethanol, 2-methoxyethyl acetate and γ-butyrolactone.

18. A castable resis composition of claim 17 wherein the solubilizing agent is ethyl 3-diazo-2,4-dioxodecalincarboxylate.

19. A castable resist composition comprising the lithographic resist composition of claim 1 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate and γ-butyrolactone.

20. A castable resist composition comprising the lithographic resist composition of claim 5 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate and γ-butyrolactone.

21. A castable resist composition comprising the lithographic resist composition of claim 6 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate and γ-butyrolactone.

22. A castable resist composition comprising the lithographic resist composition of claim 7 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate and γ-butyrolactone.

23. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 15.

24. A process for forming a lithographic resist image comprising image-wise exposing to deep UV light of less then about 300 nm a film cast on a substrate and dissolving the exposed portion of said film with a basic solution, wherein the film cast on the substrate comprises a film cast from the castable composition of claim 16.

25. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 17.

26. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 18.

27. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 19.

28. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 20.

29. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 21.

30. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 22.

* * * * *

UNITED STATES PATENT AND TRADEMARK OFFICE
CERTIFICATE OF CORRECTION

PATENT NO. : 4,624,908

DATED : November 25, 1986

INVENTOR(S) : George Schwartzkopf

It is certified that error appears in the above-identified patent and that said Letters Patent is hereby corrected as shown below:

Column 2, lines 21 to 28, the formula should read:

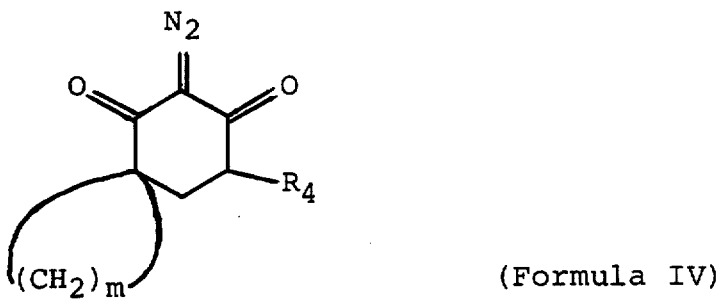

(Formula IV)

Column 2, lines 30 to 38, the formula should read:

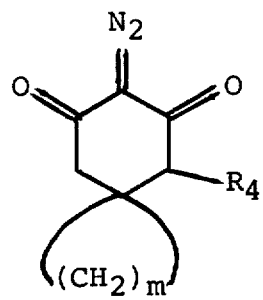

Column 3, line 13, "6.38 nmole" should read "6.38 mmole";
column 3, line 16, "1.128 gm" should read "1.28 gm".
Column 5, line 5, "pre-backed" should read "pre-baked";
column 5, line 44, "backed" should read "baked".

UNITED STATES PATENT AND TRADEMARK OFFICE
CERTIFICATE OF CORRECTION

PATENT NO. : 4,624,908

DATED : November 25, 1986

INVENTOR(S) : George Schwartzkopf

It is certified that error appears in the above-identified patent and that said Letters Patent is hereby corrected as shown below:

Column 7, lines 5 to 12, the formula should read:

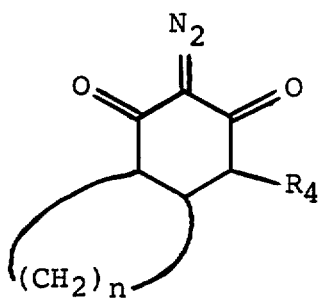

Column 7, lines 19 to 26, the formula should read:

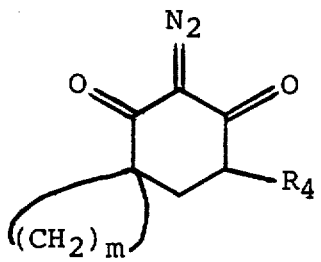

UNITED STATES PATENT AND TRADEMARK OFFICE
CERTIFICATE OF CORRECTION

PATENT NO. : 4,624,908

DATED : November 25, 1986

INVENTOR(S) : George Schwartzkopf

It is certified that error appears in the above-identified patent and that said Letters Patent is hereby corrected as shown below:

Column 7, lines 33 to 40, the formula should read:

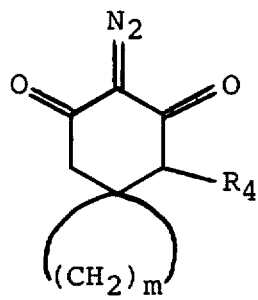

Column 8, line 10, "resis" should read "resist".

Signed and Sealed this

Twelfth Day of January, 1988

*Attest:*

DONALD J. QUIGG

*Attesting Officer*  *Commissioner of Patents and Trademarks*